United States Patent
Zhou et al.

(10) Patent No.: US 8,832,932 B2
(45) Date of Patent: Sep. 16, 2014

(54) METHOD OF MOUNTING AN ELECTRONIC COMPONENT ON A CIRCUIT BOARD

(75) Inventors: Xiao-Hui Zhou, Shenzhen (CN); Hong Li, Shenzhen (CN); Ping Li, Shenzhen (CN); Rui Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 57 days.

(21) Appl. No.: 13/305,756

(22) Filed: Nov. 29, 2011

(65) Prior Publication Data

US 2013/0003331 A1   Jan. 3, 2013

(30) Foreign Application Priority Data

Jun. 28, 2011   (CN) .......................... 2011 1 0176813

(51) Int. Cl.
  *H05K 3/30*   (2006.01)
  *H05K 1/14*   (2006.01)
  *H05K 3/00*   (2006.01)
  *H05K 3/36*   (2006.01)

(52) U.S. Cl.
  CPC .............. *H05K 1/141* (2013.01); *H05K 3/0052* (2013.01); *H05K 2201/048* (2013.01); *H05K 2201/09145* (2013.01); *H05K 3/306* (2013.01); *H05K 3/366* (2013.01)
  USPC .................. 29/832; 29/830; 29/840; 29/852; 439/66

(58) Field of Classification Search
  USPC ........................ 29/830, 832, 840, 852; 439/66
  See application file for complete search history.

(56) References Cited

U.S. PATENT DOCUMENTS

| | | | | |
|---|---|---|---|---|
| 6,097,609 A | * | 8/2000 | Kabadi | 361/760 |
| 6,312,266 B1 | * | 11/2001 | Fan et al. | 439/91 |
| 6,638,077 B1 | * | 10/2003 | Fan et al. | 439/66 |
| 6,663,399 B2 | * | 12/2003 | Ali et al. | 439/66 |
| 7,121,839 B2 | * | 10/2006 | Rathburn | 439/66 |

* cited by examiner

*Primary Examiner* — Carl Arbes
(74) *Attorney, Agent, or Firm* — Novak Druce Connolly Bove + Quigg LLP

(57) ABSTRACT

A printed circuit board assembly (PCBA) includes a printed circuit board (PCB) with through holes, a supporting member standing on the PCB adjacent to the through holes, and an electronic component mounted on the PCB is provided. The electronic component includes a component body and a plurality of conductive leads. Fixing ends of the conductive leads of the electronic component is received in the though hole and electrically and mechanically fixed to the PCB. The component body of the electronic component is supported by the supporting member.

8 Claims, 6 Drawing Sheets

METHOD OF MOUNTING AN ELECTRONIC COMPONENT ON A CIRCUIT BOARD

CROSS-REFERENCE TO RELATED APPLICATION

This application is related to, and claims the benefit of, a foreign priority application filed in China as Serial No. 201110176813.2 on Jun. 28, 2011. The related application is incorporated herein by reference.

BACKGROUND

1. Technical Field

The present disclosure relates to printed circuit boards (PCBs), and particularly, to a printed circuit board assembly (PCBA) and a method for mounting electronic components on a PCB.

2. Description of Related Art

A typical PCB includes a non-conductive substrate and conductive traces formed by etching metal sheets laminated onto a surface of the non-conductive substrate. The PCB is used to mechanically support electronic components attached thereon, and to electrically connect the electronic components by the use of the conductive traces. Thus, electronic components such as resistors, capacitors and integrated circuit (IC) chips can be mounted onto the substrate and interconnected by the conductive traces to constitute a functional circuit. Generally, a PCB populated with electronic components is known as a printed circuit board assembly (PCBA).

Soldering technology is used for mounting the electronic components onto the PCB. Typically, through holes can be formed in the PCB at predetermined mounting locations for the electronic components. The electronic components are positioned above a support surface of the PCB, and conductive leads (such as pins) of the electronic components are inserted into the through holes. Then the conductive leads are electrically and mechanically fixed to soldering pads of the corresponding conductive traces with solder.

Some of the electronic components, such as one or more Hall elements, need to maintain a certain height above the PCB after being mounted. When a Hall element is positioned at an appropriate height, it is able to perform a sensing function through the so-called Hall effect. To ensure that the required heights of the Hall elements are maintained, the conductive leads of the Hall elements should be relatively long. However, when the long leads are fixed to the PCB, the reliability of the fixing is not as good as that of electronic components having short leads.

What is needed, therefore, is a PCBA that can overcome the described limitations, and what is also needed is a method for mounting electronic components on a PCB which can overcome the described limitations.

BRIEF DESCRIPTION OF THE DRAWINGS

The components in the drawings are not necessarily drawn to scale, the emphasis instead placed upon clearly illustrating the principles of at least one embodiment. In the drawings, like reference numerals designate corresponding parts throughout the various views, and all the views are schematic.

DETAILED DESCRIPTION

Reference will now be made to the drawings to describe certain exemplary embodiments of the present disclosure in detail.

PCBAs are widely used in electronic devices, such as laptops, mobile phones, potable media players and the like, for providing functional circuits constituted by interconnected electronic components. In the following description, a laptop using a PCBA is taken as an example. It should be noted, however, that the PCBA as illustrated in the present disclosure can also be used in other electronic devices.

Figure 1:
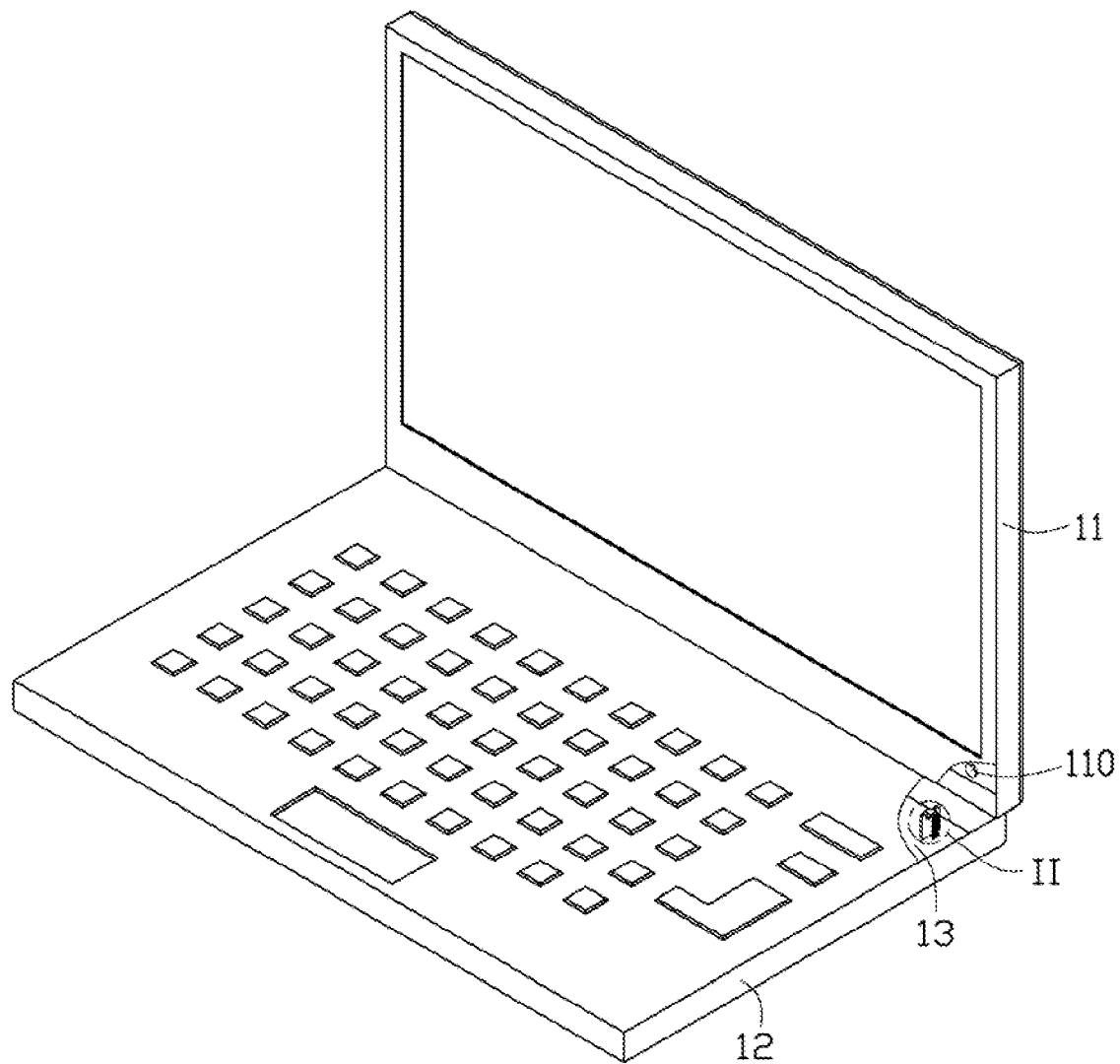
FIG. 1 is an isometric, cutaway view of a laptop according to one embodiment of the present disclosure, the laptop including a PCBA, the PCBA including a PCB with electronic components mounted thereon.

FIG. 1 is an isometric, cutaway view of a laptop 10 according to one embodiment of the present disclosure. The laptop 10 includes a main body 12, and a display body 11 foldably engaged with the main body 12. The main body 12 includes a keyboard disposed on an operation surface (i.e., a top surface) of the main body 12, and a PCBA disposed inside the main body 12.

Figure 2:
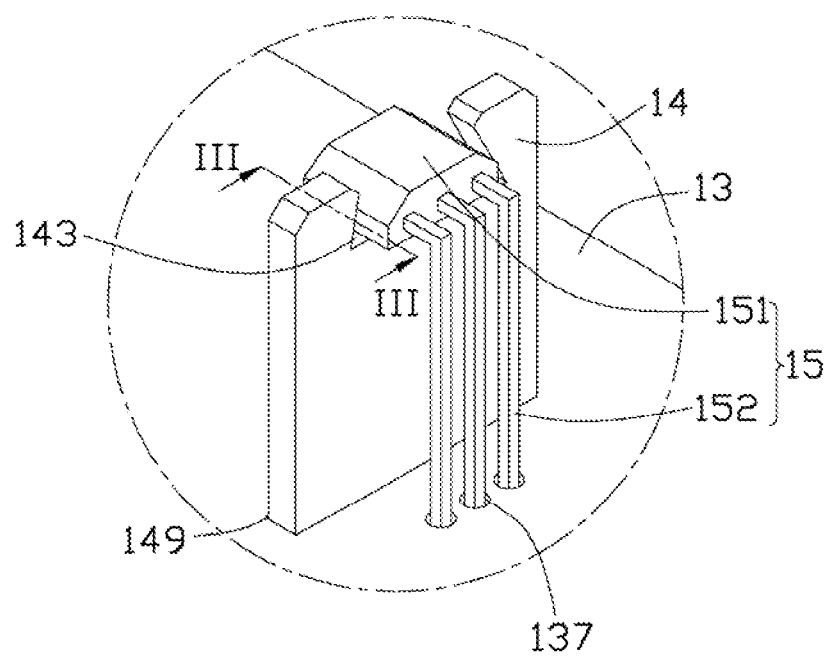
FIG. 2 is an enlarged view of a circled region II of the PCBA in the laptop of FIG. 1, illustrating an electronic component mounted on the PCB.
Figure 3:
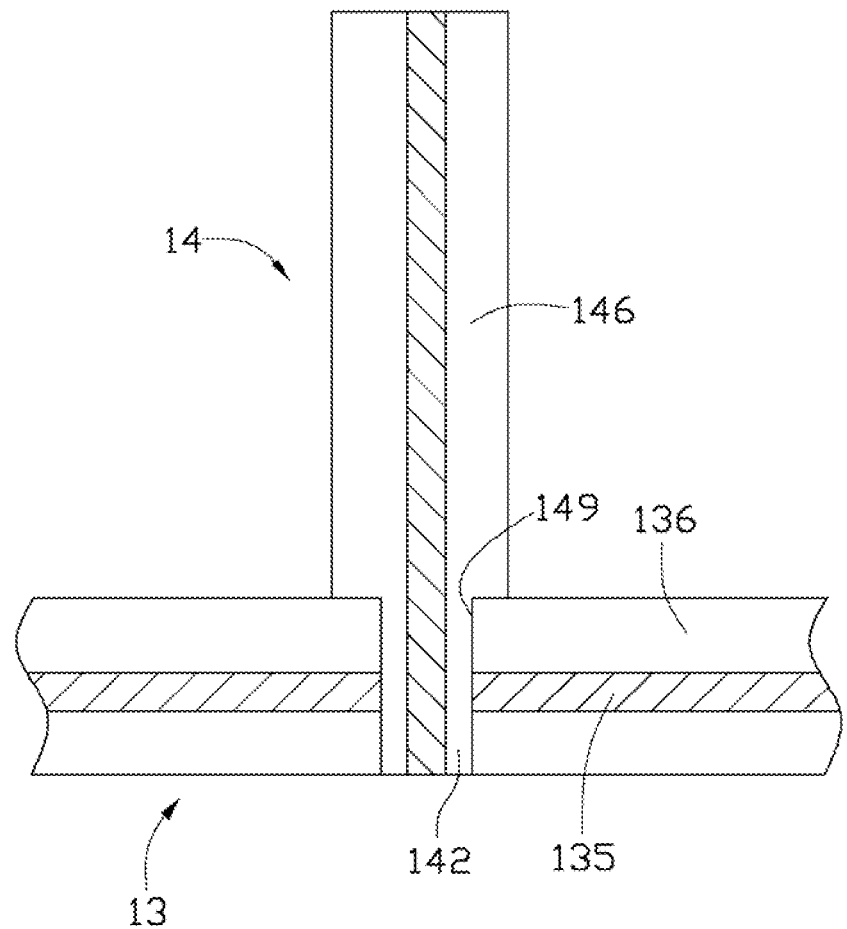
FIG. 3 is an enlarged, cross-sectional view of the PCBA of FIG. 2, taken along line III-III thereof.

Referring also to FIGS. 2-3, the PCBA includes a PCB 13 and electronic components 15 mounted on the PCB 13. The PCB 13 includes a non-conductive substrate 136 and inner conductive traces 135, and through holes 137 are defined in the substrate 136 at mounting locations for the electronic components 15. Each of the electronic components 15 includes a component body 151, and a plurality of conductive leads 152 perpendicularly extending from the component body 151. Fixing ends of the conductive leads 152 of the electronic components 15 are inserted in the corresponding through holes 137 and electrically contact the conductive traces 135 of the PCB 13. Additionally, soldering material may further be provided to mechanically fix the fixing ends of the conductive leads 152 to the PCB 13.

One or more of the electronic components 15 may be a Hall element that needs to disposed at a certain height above the PCB 13. In the following description, unless the context indicates otherwise, the electronic component 15 described is a Hall element. In one embodiment, a supporting member 14 may stand vertically on the substrate 136 of the PCB 13 to support the component body 151 of the electronic component 15, and thereby ensure the needed elevation of the electronic component 15. The supporting member 14 may be a supporting board, having a main board 146 and a fixing portion 142 extending from a bottom end of the main board 146. The fixing portion 142 and the main board 146 may be integrated in one piece. The fixing portion 142 and the main board 146 of the supporting member 14 may have substantially the same type of configuration as the PCB 13. That is, the supporting member 14 can include a non-conductive substrate and inner conductive traces at both the fixing portion 142 and the main board 146 thereof. The fixing portion 142 may have an extending length substantially the same as a thickness of the substrate 136 of the PCB 13, and have a thickness less than that of the main board 146. With such configuration, the fixing portion 142 is received in an accommodating groove 149 defined in the substrate 136 so as to fix the supporting member 14 on the PCB 13. The accommodating groove 149 is adjacent to the through holes 137 where the conductive leads 152 of the electronic component 15 are inserted, and may have a width substantially the same as the thickness of the fixing portion 142. That is, the width of the accommodating groove 149 is also less than the thickness of the main board 146.

The main board 146 of the supporting member 14 defines a cutout 143 at a middle of a top end thereof, to receive the component body 151 of the electronic component 15. The cutout 143 may have an isosceles trapezoid shape, and the component body 151 may have a configuration such that a top portion thereof is smaller than a bottom portion thereof. Moreover, a top width of the cutout 143 may be less than a width of the bottom portion of the component body 151, such that the component body 151 is capable of being pressed into the cutout 143 and being clamped by the supporting member 14 tightly.

Furthermore, referring to FIG. 1 again, a magnet element 110 may be disposed at a corner of the display body 11, and the magnet element 110 may cooperate with the electronic component 15 supported by the supporting member 14 to form a sensor. For example, when the display body 12 is folded down towards the main body 12, a sensing signal indicating that the display body 12 is being folded may be induced in the electronic component 15 due to the magnet element 110. The sensing signal may be transmitted to a control circuit installed in the PCBA, and trigger the control circuit to perform a corresponding operation such as turning off the power of the display body 11.

Figure 4:
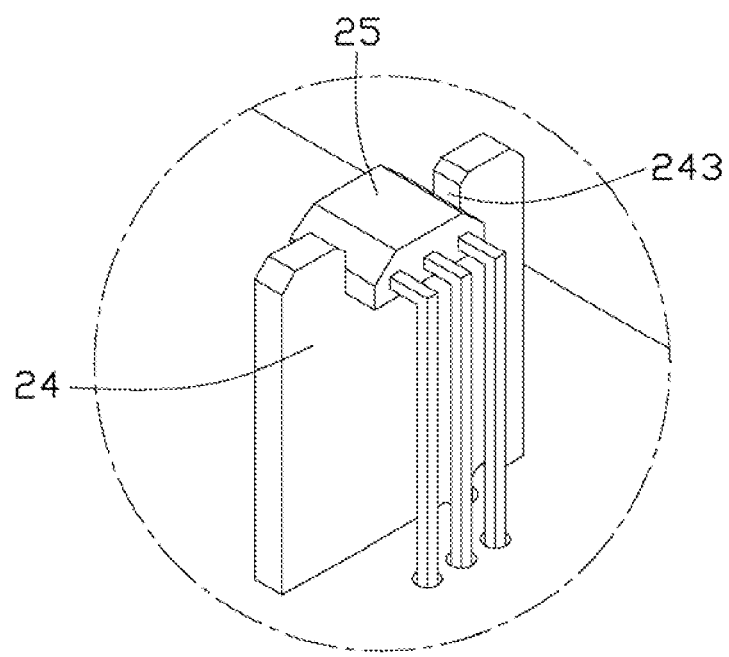
FIG. 4 is an isometric view of a PCBA according to another embodiment of the present disclosure.

FIG. 4 is an isometric view of a PCBA according to another embodiment of the present disclosure. The PCBA in FIG. 4 differs from the above-described PCBA in FIG. 2 as follows. A cutout 243 of a supporting member 24 for receiving an electronic component 25 has a rectangular shape, rather than an isosceles trapezoid shape. In addition, a width of the cutout 243 is slightly less than that of the electronic component 25, in order that the electronic component 25 is tightly clamped by the supporting member 24.

Figure 5:
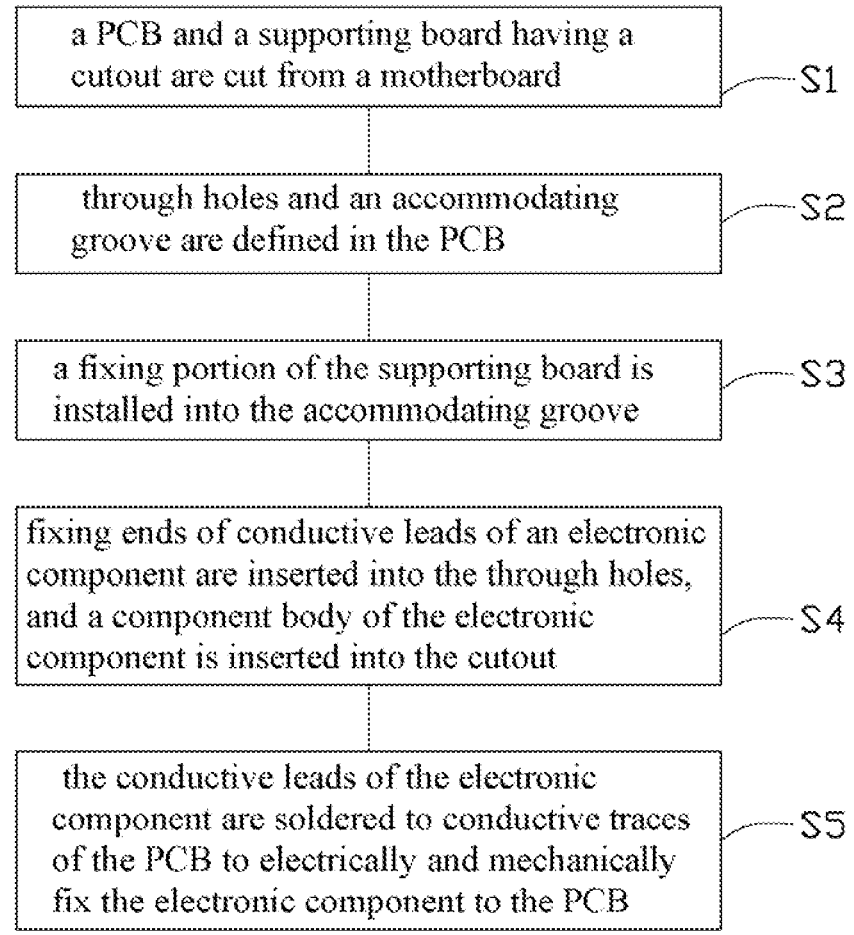
FIG. 5 is a flowchart of a method for obtaining a PCB and mounting an electronic component on the PCB, according to an embodiment of the present disclosure.

On the basis of the configurations of the PCBAs as described in the above embodiments, the present disclosure further provides a method for obtaining a PCB and mounting an electronic component on the PCB. Referring to FIG. 5, the method may include the following steps.

Step S1, a PCB and a supporting board having a cutout are cut from a motherboard.

Figure 6:
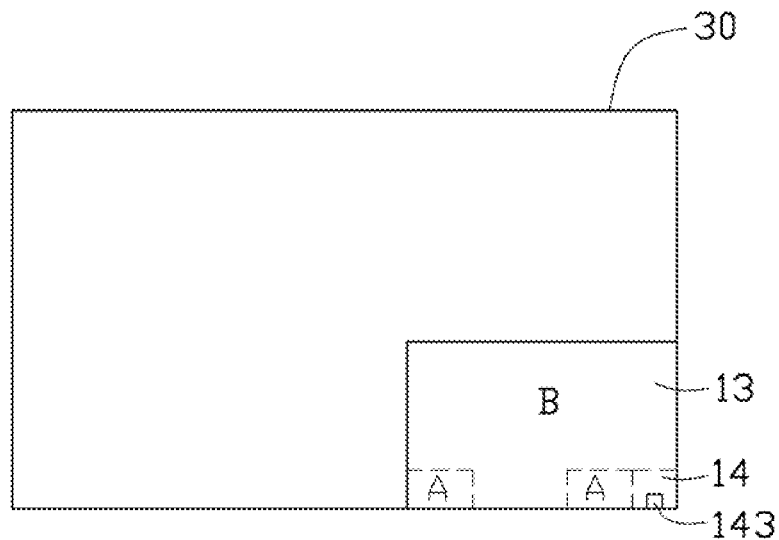
FIG. 6 is a plan view of an exemplary motherboard used in the method of FIG. 5.

Referring to FIG. 6, a motherboard 30 for making a plurality of PCBs 13 is shown. The motherboard 30 includes a plurality of main regions B (only one shown) and a plurality of minor regions A. In step S1, one main region B is cut from the motherboard 30 and serves as a PCB 13, and a supporting board 14 having a cutout 143 is cut from one of the minor regions A. The cutout 143 may be formed a middle of a top end of the supporting board 14, and may have an isosceles trapezoid shape. Alternatively, the cutout 143 may have a rectangular shape.

Step S2, through holes and an accommodating groove are defined in the PCB.

In this step, for example, a plurality of through holes 137 for receiving conductive leads 152 of an electronic component 15 is defined in the PCB 13 at predetermined mounting locations, and an accommodating groove 149 is also defined in the PCB 13. The accommodating groove 149 may be adjacent to the through holes 137, and have a width less than a thickness of the supporting board 14.

Step S3, a fixing portion of the supporting board is installed into the accommodating groove.

In this step S3, a bottom end of the supporting board 14 may be trimmed to form a fixing portion 142, which has a thickness such that it can be interferentially received in the accommodating groove 149. Then, the fixing portion 142 of the supporting board 14 is installed into the accommodating groove 149 to make the supporting board 14 stand vertically on the PCB 13.

Step S4, fixing ends of conductive leads of an electronic component are inserted into the through holes, and a component body of the electronic component is inserted into the cutout.

In one embodiment, the conductive leads 152 of the electronic component 15 may extend substantially perpendicularly from the component body 151. Thus, for example, the fixing ends of the conductive leads 152 of the electronic component 15 may be inserted into the through holes 137 of the PCB 13 and electrically contact the conductive traces 135 of the PCB 13. Moreover, the component body 151 of the electronic component 15 can be pressed into the cutout 143 and supported by the supporting board 14, such that the component body 151 maintains a predetermined height above the PCB 13. As such, the electronic component 15 is clamped in the cutout 143.

Step S5, the conductive leads of the electronic component are soldered to the conductive traces of the PCB to electrically and mechanically fix the electronic component to the PCB. Thus, a PCBA of either of the embodiments described above is manufactured.

It is to be further understood that even though numerous characteristics and advantages of preferred and exemplary embodiments have been set out in the foregoing description, together with details of the structures and functions of the embodiments, the disclosure is illustrative only; and that changes may be made in detail, especially in matters of shape, size and arrangement of parts within the principles of the present disclosure to the full extent indicated by the broad general meaning of the terms in which the appended claims are expressed.

What is claimed is:

1. A method for mounting an electronic component on a printed circuit board, the method comprising:
    forming a plurality of through holes in the printed circuit board at predetermined mounting locations;
    installing a supporting board on the printed circuit board adjacent to the through holes;
    inserting fixing ends of conductive leads of the electronic component into the through holes; and
    fixing a component body of the electronic component on the supporting board to make the component body of the electronic component maintain a predetermined height above the printed circuit board.

2. The method of claim 1, wherein the printed circuit board and the supporting board are both cut from a motherboard, and the printed circuit board and the supporting board have a substantially same configuration comprising an non-conductive substrate and one or more inner conductive traces.

3. The method of claim 2, further comprising:
    soldering the conductive leads of the electronic component to the conductive traces of the printed circuit board to electrically and mechanically fix the electronic component to the PCB.

4. The method of claim 1, wherein the installing a supporting board vertically on the printed circuit board and adjacent to the through holes comprises:

forming an accommodating groove at the printed circuit board and adjacent to the through holes; and installing a fixing portion of the supporting board into the accommodating groove to make the supporting board stand vertically on the printed circuit board.

5. The method of claim 4, wherein the accommodating groove has a width less than a thickness of the supporting board, and the installing a supporting board vertically on the printed circuit board and adjacent to the through holes further comprises:

thinning a bottom end of the supporting board to form the fixing portion extending from a main board of the supporting board and having a thickness adapting to the accommodating groove.

6. The method of claim 1, wherein the inserting a component body of the electronic component on the supporting board comprises:

forming a cutout at a top end of the supporting board; and inserting the component body of the electronic component into the cutout at the supporting board.

7. The method of claim 6, wherein the cutout has an isosceles trapezoid shape, and a top width of the cutout is less than a width of a bottom portion of the component body.

8. The method of claim 6, wherein the cutout has a rectangular shaped, and a width of the cutout is slightly less than a width of the component body.

* * * * *